United States Patent [19]
Siegel et al.

[11] Patent Number: 5,180,440
[45] Date of Patent: Jan. 19, 1993

[54] PRINTED CIRCUIT THERMOCOUPLE ARRANGEMENTS FOR PERSONNEL TRAINING AND EQUIPMENT EVALUATION PURPOSES

[75] Inventors: William J. Siegel; Louis A. Abbagnaro, both of Silver Spring; William J. Kantter, Columbia, all of Md.

[73] Assignee: Pace Incorporated, Laurel, Md.

[21] Appl. No.: 817,964

[22] Filed: Jan. 8, 1992

Related U.S. Application Data

[63] Continuation of Ser. No. 276,432, Nov. 23, 1988, abandoned.

[51] Int. Cl.⁵ ............................................. H01L 35/02
[52] U.S. Cl. ..................................... 136/230; 136/200; 136/225; 434/234; 228/103; 174/263; 29/829
[58] Field of Search ............... 136/201, 200, 225, 230; 434/234; 346/33 TP; 228/103; 219/85.22, 829; 174/263

[56] References Cited

U.S. PATENT DOCUMENTS

| | | | |
|---|---|---|---|
| 4,197,738 | 4/1980 | Degenne | 73/190 |
| 4,224,744 | 9/1980 | Siegel et al. | 35/13 |
| 4,343,960 | 8/1982 | Eguchi et al. | 136/225 |
| 4,631,350 | 12/1986 | Germanton et al. | 136/225 |
| 4,795,498 | 1/1989 | Germanton et al. | 136/225 |
| 4,817,436 | 4/1989 | Sallée et al. | 73/708 |

FOREIGN PATENT DOCUMENTS

| | | | |
|---|---|---|---|
| 2238252 | 2/1975 | France | 136/225 |
| 0010875 | 1/1983 | Japan | 136/225 |

OTHER PUBLICATIONS

Mish, Fredrick C., ed., *Webster's Ninth New Collegiate Dictionary*, 1985, p. 408.
Article—"Electronics", Oct. 1948, pp. 192, 194.

*Primary Examiner*—Donald P. Walsh
*Assistant Examiner*—Chrisman D. Carroll
*Attorney, Agent, or Firm*—Sixbey, Friedman, Leedom & Ferguson

[57] ABSTRACT

A thermocouple arrangement for developing, evaluating, monitoring and adjusting any process performed on or otherwise so as to thermally affect a printed circuit board assembly or other electronic assembly (including bare circuit board or boards in the manufacturing process), such as soldering/desoldering and various other production, rework and repair processes including cleaning, fluxing, preheating, thermocompression bonding and spot welding. In accordance with various embodiments, a layer of a first conductor material is applied on a first surface of an electrically insulative support, while a second layer of a second, dissimilar, conductor material is applied to at least one other surface of the support using conventional printed circuit board construction techniques. At those locations where thermocouple junctions are required, holes are drilled through the conductor layers and support material, and then the two layers of conductor are electrically connected by a plating of the first conductor material through the through hole. The voltages produced by the thermocouples during a production/repair/rework operation on an emulated electronic assembly may be monitored and used to develop, modify or adjust the operation of thermally affecting processes thereon, train personnel or evaluate equipment. Numerous different processes can be evaluated involving different permutations of thermal mass configurations, heat source locations and types, and thermocouple locations.

19 Claims, 3 Drawing Sheets

PRINTED CIRCUIT THERMOCOUPLE ARRANGEMENTS FOR PERSONNEL TRAINING AND EQUIPMENT EVALUATION PURPOSES

This application is a continuation of Ser. No. 276,432, filed Nov. 23, 1988, now abandoned.

BACKGROUND OF THE INVENTION

The present invention relates to thermocouples which are used in conjunction with printed circuit boards for training personnel in soldering/desoldering of leads of circuit components to the printed circuit boards, as well as for conducting a quantitative analysis of the performance of repair, rework, and production equipment used for soldering/desoldering, cleaning, preheating, and spot-welding of components mounted to printed circuit boards. In particular, the invention relates to the formation of thermocouples for such purposes by standard printed circuit board construction techniques, as opposed to standard thermocouple construction techniques, as well as the manner in which they can be made and used to emulate or simulate a wide variety of circuit board types, layouts and assembly configurations.

In commonly owned U.S. Pat. No. 4,224,744, circuitry for teaching soldering and a practice circuit board for use therewith are disclosed, wherein a training board having a plurality of terminals thereon and wherein a plurality of temperature sensing devices associated with the respective terminals are provided at each terminal where the soldering of a joint is attempted to monitor the performance of a trainee or other person whose repair skills are being evaluated. One form of temperature sensing means that is disclosed is the provision of thermocouples at each of a plurality of through holes formed in a printed circuit board. These thermocouples are comprised of a first conductor, such as electroless copper, that is plated through the holes so as to form pads or lands at each of opposite sides of the printed circuit board, and a metal foil or wire made of iron or constantan or some other dissimilar conductor metal from that of the plated through hole that is attached to one of the pads or lands of the plated through conductor, whereby a thermocouple junction is formed. For formation of these thermocouple junctions, the use of electrical arc, flame heating, soldering, swagging, welding, brazing, beading, or butt-welding techniques are disclosed. Furthermore, while this patent indicates that its disclosure is also applicable to desoldering, welding, etc., as well as to circuit connections other than those on a single or double-sided printed circuit board, such as multilayer boards, ceramic printed circuits, etc., and various terminations such as plated through holes, unsupported holes, funnelets, eyelets, standoffs, etc., no structures, techniques or applications are disclosed which are either directed to the emulation or simulation of a wide assortment of circuit board layouts, types and assembly configurations which vary by component type, substrate material, thermal characteristics and other factors, or to the application thereof to the development, evaluation, monitoring and adjustment of "thermally affecting" production, rework or repair processes and equipment used therefor, i.e., for soldering/desoldering, preheating, spot-welding, etc.

Commonly owned U.S. Pat. No. 4,224,744 also discloses in detail the various factors which impact upon the ability to perform high quality rework and repair operations upon electronic assemblies, and this description is hereby incorporated by reference for the sake of brevity. These factors include not only the human factor, for which training to obtain the requisite skills and experience to enable the operator to observe the work and react appropriately in the manipulation of the soldering iron or other rework and repair device is the best insurance, but also includes other factors which are not operator dependent, such as the characteristics of the rework and repair device, e.g., a soldering iron for which its idle tip temperature, recovery rate, etc., and characteristics of the component and printed circuit board, such as temperature, thermal conductivity, specific heat, etc. As a result, for proper training and evaluation of personnel, it is desirable to be able to simulate as realistically as possible a wide range of circumstances an operator is likely to encounter. Also, even with the best of training, the potential exists for overheating the work, as a result of excessive dwell times or temperatures, so as to cause printed circuit board damage in the form of lifted pads, damage to plated through holes, or, in extreme cases, damage to the fiberglass laminate, etc., as a result of equipment related factors. Thus, it is also desirable to provide a means by which new equipment can be evaluated, particularly automatic equipment, through analysis of the temperature profile that, for example, a soldered joint is exposed to during, for example, a soldering/desoldering process.

The normal method of soldered joint inspection is visual. However, such a qualitative method of analysis is ineffective since the physical appearance of a soldered joint, after it has been made, gives no real indication of the maximum temperature that the joint achieved or how long it was maintained at that temperature. On the other hand, to obtain a quantitative analysis of the temperature conditions to which a joint is subjected, thermocouples have to be attached to the circuit pads and/or component leads, so that temperatures can be recorded utilizing a computer data logging system. However, attaching thermocouples to leads or pads, usually done by spot welding, is a difficult task, and if multiple joints are to be analyzed, the task becomes cumbersome and expensive as each thermocouple costs approximately $5.

SUMMARY OF THE INVENTION

It is an object of the present invention to provide a thermocouple construction and process which will enable a wide assortment of printed circuit board types, layouts and assembly configurations, varying in component type, substrate material, thermal characteristics and other factors, to be simply and inexpensively emulated.

A particular object of the invention is to adapt standard printed circuit board construction techniques to the preceding object.

Another important object is to provide processes whereby a thermocouple construction in accordance with the invention may be employed in the development, evaluation, monitoring and adjustment of thermally affecting processes, processing equipment and human factors associated therewith.

It is a further object of the present invention to enable the quantitative analysis of temperature profiles that will be produced in emulated printed circuit board assemblies during performance of an actual thermally affecting production, rework and repair process, such as soldering, desoldering, cleaning, fluxing, preheating, thermocompression bonding, spot welding and other processes which can thermally affect such assemblies for purposes of evaluating the process and processing equipment and for training or recertifying of repair personnel, via measurement of the temperature experienced by solder joints, component leads, and/or substrate material of a printed circuit board assembly in a test process operation.

The foregoing objects of the invention are achieved in accordance with various embodiments wherein a layer of a first conductor material, such as copper, is applied on a first surface of an electrically insulative support, while a second layer of a second, dissimilar, conductor material, such as constantan, is applied to at least one other surface of the support using conventional printed circuit board construction techniques, as opposed to standard thermocouple construction techniques. At those locations where thermocouple junctions are required, holes are drilled through the conductor layers and support material, and then the two layers of conductor are electrically connected by a plating of the first conductor material through the through hole and onto respective pad terminal portions of the conductor layers. The voltages produced by the thermocouples during a production/repair/rework operation on an emulated electronic assembly may be monitored and used to develop, modify or adjust the operation of thermally affecting processes thereon, train personnel or evaluate equipment. Numerous different processes can be evaluated involving different permutations of thermal mass configurations, heat source locations and types, and thermocouple locations.

These and further objects, features and advantages of the present invention will become more obvious from the following description when taken in connection with the accompanying drawings which show, for purposes of illustration only, several embodiments in accordance with the present invention.

DETAILED DESCRIPTION OF THE PREFERRED EMBODIMENTS

Figure 1:
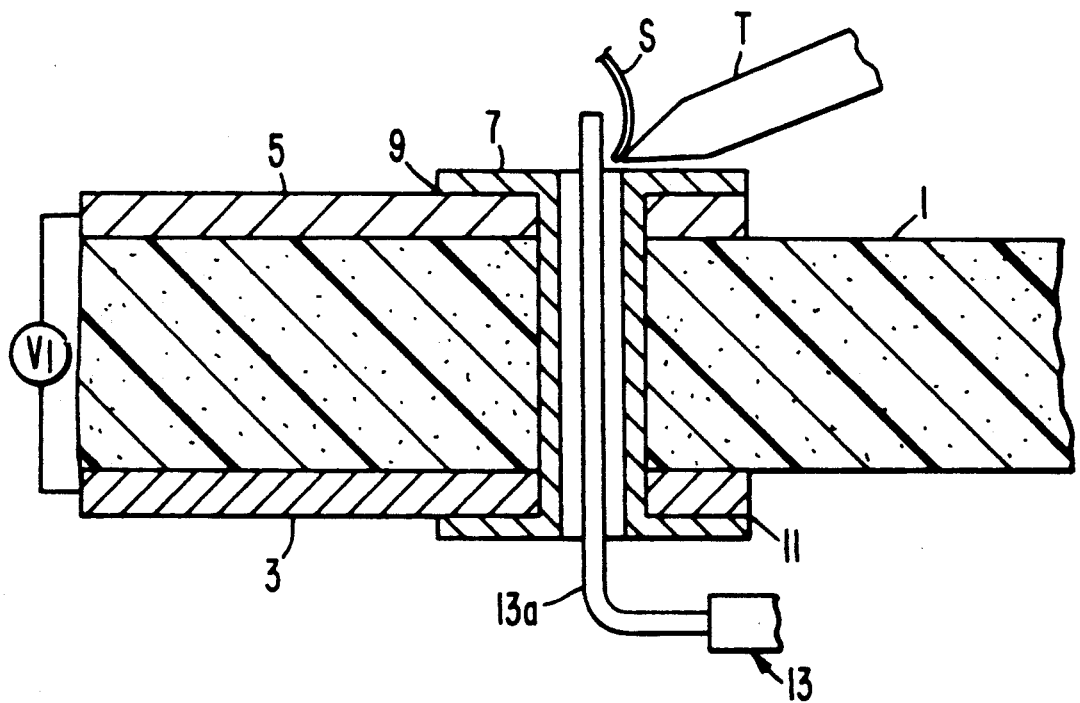
FIG. 1 is a partial cross-sectional view of a printed circuit thermocouple construction for a simple circuit board having a through hole mounted component.
Figure 2:
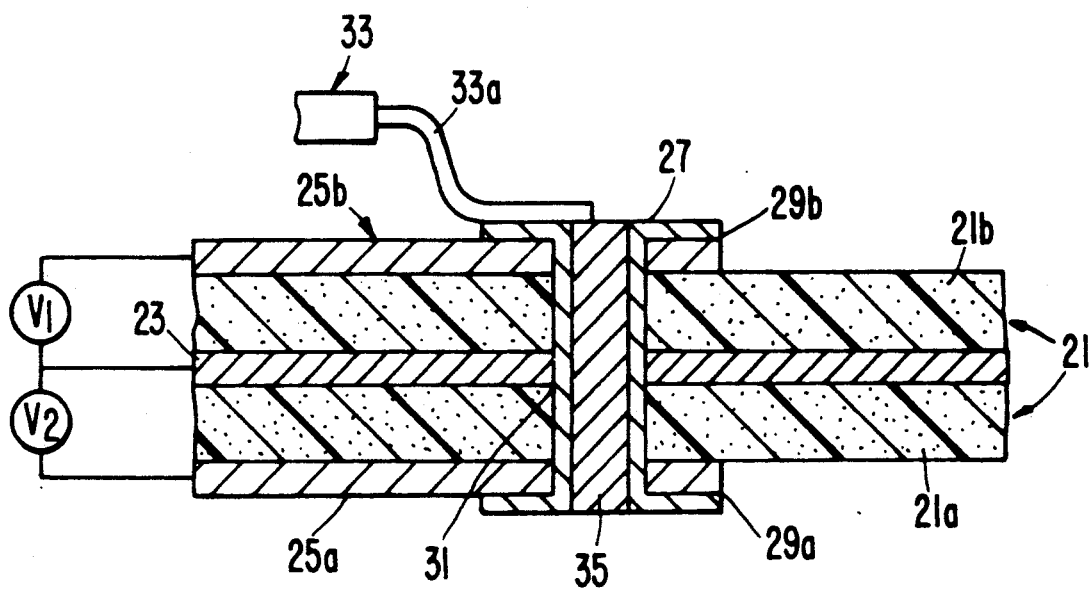
FIG. 2 illustrates, in cross section, a portion of a printed circuit thermocouple construction for monitoring temperature at both sides of a three layer printed circuit board having a surface mounted component.
Figure 3:
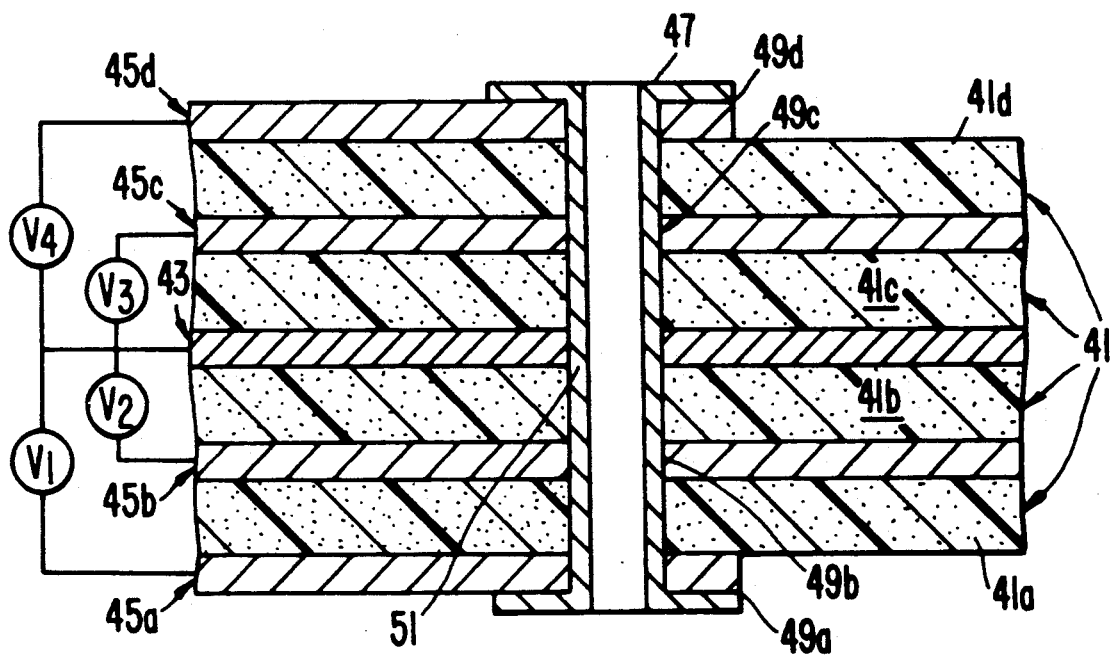
FIG. 3 illustrates, in cross section, a portion of a printed circuit thermocouple construction for providing a detailed analysis of the temperature gradient of a multilayer printed circuit board.

In FIG. 1, a basic thermocouple arrangement for providing temperature data resulting from a test printed circuit board rework, repair, or production operation, involving at least one "thermally affecting process," is illustrated of a type that might be used for the purpose of training students in the art of soldering in the manner of the above-noted U.S. Pat. No. 4,224,744 (which is incorporated by reference), or for recertifying of experienced repair personnel, or in the evaluating of new rework and repair equipment. In this regard, it is pointed out that, for purposes of this application, the term "thermally affecting process" is used to define any of the many processes used in the reworking, repairing or producing of electronic assemblies (such as soldering, desoldering, cleaning, fluxing, preheating, thermocompression bonding, spot welding, cooling, and other processes involved in the installation, removal and replacement of through hole or surface mounted components) that can affect the structure, operability and/or appearance of any part of an electronic assembly due to temperature effects. It is also noted that even though the construction of the embodiments of FIGS. 1–3 is being described with reference to only a single thermocouple junction of the inventive arrangement, it should be appreciated that a thermocouple arrangement for emulating an electronic assembly (including bare circuit boards and boards in the manufacturing process) in accordance with the present invention will comprise at least as many thermocouple junction sites as the number of leads of the number of components to be utilized in conjunction therewith.

In particular, the printed circuit thermocouple arrangement of FIG. 1 is comprised of an electrically insulative support 1, which may be a standard circuit board substrate formed of glass reinforced epoxy or other suitable material. A layer of a first conductor material, such as copper, is applied on the first surface of the support 1, while a second layer of a second conductor material, that is dissimilar to the first conductor material, such as constantan, is applied to the opposite side of the support 1. These layers of conductor material are formed utilizing conventional printed circuit board construction techniques. For example, a copper foil 3, approximately 0.002 inches thick is laminated to one side of the substrate, while a constantan foil 5, of approximately 0.002 inches thick, is laminated to the other side. At those locations where thermocouple junctions are required, holes are drilled through the foils and substrate laminate and then pad terminal portions, in the form of lands, are defined around the holes on both sides of the support 1, using photomasking techniques. Electroless copper 7 is then plated on the pads, as defined by the photomasked pattern, on both the copper and constantan foils and through the holes. The copper plating 7 electrically and mechanically connects the copper and constantan foils forming a T-type thermocouple junction. Signal monitoring connection portions and trace interconnections running between the signal monitoring portions and the lands are then formed on both foils using photomasking techniques and the unwanted copper and constantan foil is then removed using a suitable etchant, such as ferric chloride, to complete the ciruitry pattern.

As a result of the above steps, a thermocouple junction 9 will be formed at the interface between the respective thermocouple pad terminal portion of the printed circuit pattern of constantan 5 and the plated-on copper 7. Thus, in every instance, the constantan conductor material will be formed into an articulated printed circuit pattern. On the other hand, since a copper-to-copper electrical connection is formed at the interface 11 between the copper layer 3 and the plated-on copper 7 at the opposite side of the insulative support 1, the layer of copper 3 may either be a matching articulated printed circuit pattern, or where load, thermal isolation or instrument sensitivity requirements will permit, the copper may be left in its original sheet form, whereby it will be coextensive in area with at least the area upon which the printed circuit pattern is formed and can totally cover the respective side of support 1.

FIG. 1 shows the thermocouple arrangement being utilized to obtain data as to the temperature profile at the point at which solder S is applied by a soldering tool T, such as a soldering iron, in the through hole mounting of an electronic component 13 having a plurality of leads, of which only the one lead 13a is shown in FIG. 1. Of course, other forms of soldering tools and automated soldering devices can be utilized in conjunction with this thermocouple arrangement, such as wave type soldering devices as are typically used in the mass production of through hole printed circuit boards (in which case the arrangement would be inverted relative to the orientation shown in FIG. 1 and disposed above a molten solder bath of a wave soldering device).

In this regard, it is noted that monitoring of the signals from the thermocouple junction in most cases can be done utilizing a typical printed circuit board edge connector or any other conventional type of connector. However, in the case where the thermocouple arrangement is disposed above a wave soldering bath, the output connections can only be made to the upper surface of the board. In FIG. 1, a simple voltage meter is merely schematically shown and is only intended to generally represent an output quantifying means for use in measuring the temperature related voltage produced by thermocouple junction 9.

In addition to soldering operations, desoldering processes can also be evaluated with the described thermocouple arrangement once a component has been mounted thereto. In that case, a solder extractor tool is placed against the solder and around the component lead on the side opposite the component body, i.e., the solder side in the case of a through hole mounting. The desoldering device is then activated to apply heat to the solder joint, and once the solder is heated above its melting point, vacuum is applied to remove the solder from the hole. Likewise, any other thermally affecting process can be monitored in a similar fashion.

In the case of the FIG. 1 embodiment, if the component were to be inserted on the constantan side, the heat necessary to melt the solder in the hole must travel through the copper plating, component lead, and the solder itself. As a result, temperature measurements taken during the desoldering process will be biased toward the component side of the board since the thermocouple junction would be on that side. For circuitry having small lands and trace portions and small mass component leads, the temperature differential from the solder side to the component side will be small. However, if, for example, a large area circuit trace or land is situated on the component side, there will exist a finite temperature differential between the solder side, where the heat is applied, and the component side where it is sensed via the thermocouple junction 9. This temperature differential is the result of the fact that the heat necessary to raise the temperature of a large circuit area to solder melt must flow through the combination of plated through hole, component lead and solder, and the through hole path has a relatively low thermal transfer rate in comparison to the heat required to raise the temperature of the component side circuitry. This low thermal transfer rate causes the heat flow from the solder side to the component side to be impeded, thereby creating the noted temperature gradient between the two sides. Thus, under such circumstances, the thermocouple junction 9 must be on the side of support 1 that the temperature is desired to be monitored at, i.e., the component 13 should be through hole mounted at the side shown in FIG. 1 or surface mounted at the opposite side (in a manner to be described below with respect to FIG. 2). On the other hand, where circuitry having small lands and circuit trace portions and/or small mass component leads are involved, suitable results will be obtained irrespective of which side of the arrangement of FIG. 1 the component is mounted at.

FIG. 2 illustrates a thermocouple arrangement for monitoring of temperature data via thermocouple heat sensors disposed on each of opposite sides thereof. With such a construction, the electrically insulative support 21 is formed of a plurality of circuit board layers 21a, 21b, and the layer of the first conductor material (e.g., copper) 23 is formed on an interface surface of the support 21 between the pair of board layers 21a, 21b. Printed circuit patterns of the second conductor material (e.g., constantan) 25a, 25b are then formed on each of the opposite outer surfaces of the insulative support 21, and are electrically and mechanically coupled to each other by a plated through electrical connection 27, as described above, relative to the conductors 3, 5 and the electrical connection 7. As a result, a pair of thermocouple junctions 29a, 29b occurs at the interfaces between the electrical connection 27 and the layers 25a, 25b, while an electrical connection 31 is produced at the interface between the first conductor layer 23 and the through hole plating of the electrical connection 27. Whether the internal layer of the first conductor 23 is a continuous sheet foil filling the interface between board layers 21a, 21b, as shown, or is an articulated pattern of traces, the interstices of which are filled with an insulator material, will be dependent, as noted above, upon load, thermal isolation and sensitivity requirements (which in most cases will make the patterning of all conductor layers preferable).

FIG. 2 also shows the surface mounting of an electronic component 33 via its lead 33a. For this purpose, unless the through hole is designed to have a very small diameter, a plug 35 of first conductor material (e.g., copper) is inserted into the through hole, or the hole may be filled or reduced to only a very small diameter by the melting of solder into it, at least at the component mounting side of the arrangement. However, the arrangement of FIG. 2 can also be utilized for through hole mounting in the manner described relative to FIG. 1.

An arrangement as is shown in FIG. 2 is particularly advantageous when evaluating a production, rework or repair process wherein an auxiliary heat source is used with a printed circuit board having a ground plane(s) or other heat sink that makes it difficult for a primary heat source, such as hot air delivered to the component side of FIG. 2, to quickly raise the temperature at the component leads to the solder melt temperature. In such a case, an auxiliary heat source is utilized to offset the undesired heat sink by bringing the board up to a premelt temperature such as 250° F. For example, if a large thermal mass is located at the bottom side of the board due to a ground plane, the primary heater may be incapable of delivering sufficient heat to raise the temperature at the component leads to solder melt temperatures due to a heat sinking by the mass which can be counterbalanced by the use of a preheater at the bottom of the board in addition to using a primary heater at the top, component side of the board, relative to FIG. 2. Thus, by utilizing an arrangement as shown in FIG. 2, wherein thermocouple junction type sensors are provided at both sides of the board, the effect of the use of combined heaters at both the top and bottom of a circuit board being emulated can be evaluated. Alternatively, the effect of only one or the other of the heaters can also be evaluated separately at both the top and bottom surfaces of support 21. These temperatures can be measured by the use of voltmeters, schematically depicted at $V_1$ and $V_2$, which measure the voltages produced by the thermocouple junctions 29a, 29b.

To obtain a more detailed analysis of the temperature profile, by examining the temperature gradient, any number of additional circuit layers can be added. For example, FIG. 3 illustrates a printed circuit thermocouple arrangement in accordance with the invention wherein the electrically insulative support 41 is subdivided into four circuit board layers 41a–41d, at each side of which a conductor layer is formed. In this case, the central conductor layer 43 is formed of a first conductor material, such as copper, while all of the other conductor layers 45a–45d are formed of the second, dissimilar, conductor material, such as constantan. All of the layers 45a–45d are of an articulated printed circuit pattern produced as described above, while layer 43 of the first conductor material, while preferably also being so patterned, may, as already pointed out for the other embodiments, be left as a continuous foil layer. The temperature gradient can then be measured by arranging voltmeters $V_1$–$V_4$ as shown in FIG. 3, for measuring the voltages produced at the thermocouple junctions 49a–49d.

While simple voltage meters are depicted as the means for monitoring the voltages produced at the thermocouple junctions of the embodiments of FIGS. 1-3, it should be appreciated that numerous other and more sophisticated means may be used. For example, analyzers and indicators of the type disclosed in the above-referenced U.S. Pat. No. 4,224,744 may be utilized, as can other comparable types of arrangements designed for particular circumstances. Moreover, data is obtainable throughout the entire operation cycle from ambient to ambient, and not merely during perforamce of a specific thermally affecting process of an overall production, rework, or repair operation.

Figure 4:
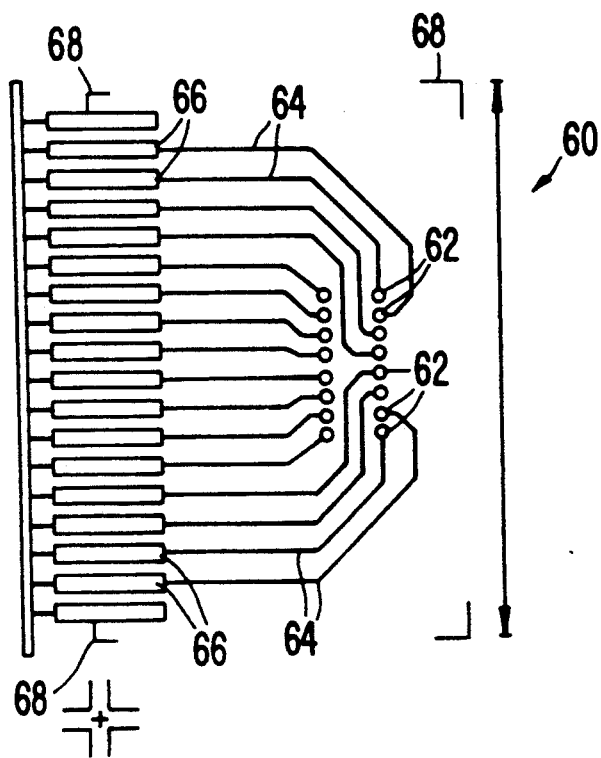
FIGS. 4 through 6 illustrate representative photomask patterns for production of printed circuit thermocouples in accordance with the present invention, FIG. 4 showing a pattern for 16 pin DIP with thermocouple junctions for each lead and equal width traces, FIG. 5 also showing a pattern for a 16 pin DIP but with lands of varying size or thermal mass, and FIG. 6 showing a pattern for a surface mount component having a land configuration for producing a complex temperature profile.
Figure 5:
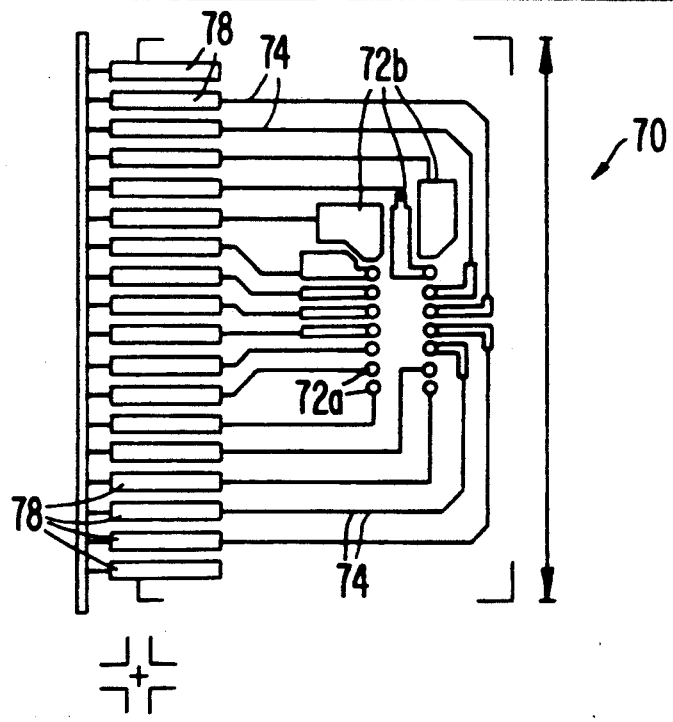
Figure 6:
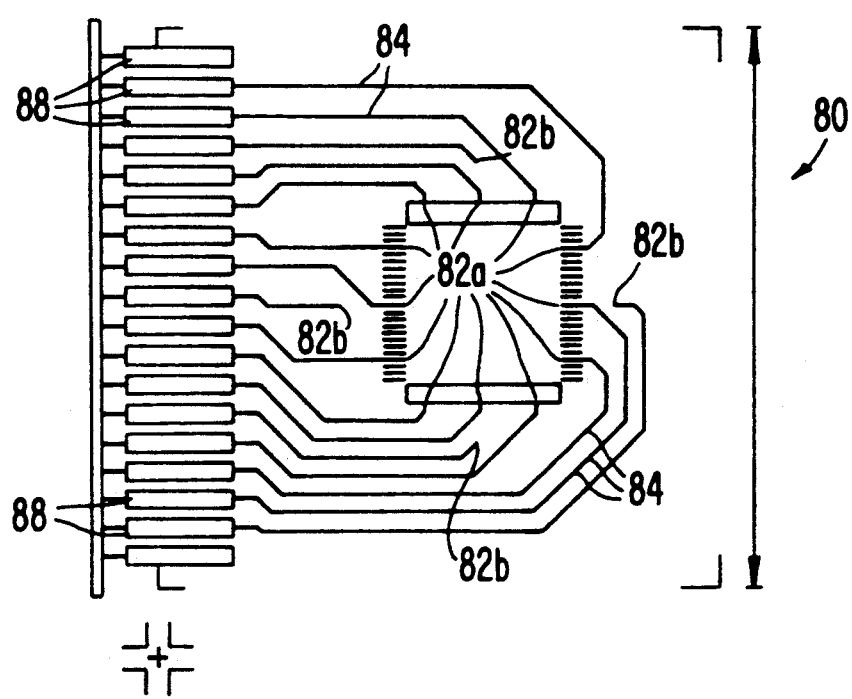

FIGS. 4–6 show printed circuit pattern masks for use in forming any of the conductor layers of the printed circuit thermocouple arrangements of FIGS. 1-3. In FIG. 4, a pattern mask 60 is shown for a 16 pin DIP having thermocouple pad terminal portions 62 for each lead and equal width trace interconnections 64 connecting the thermocouple pad terminal portions 62 with signal monitoring connection portions 66. Of course, it should be appreciated that the portions of the mask 60 that are not within the positioning frame corners 68, including the corner frames 68, would be removed by an etchant, as noted above relative to the process of making the thermocouple arrangements of the present invention.

In FIG. 5, a pattern mask 70 for a 16 pin DIP is also shown. However, in this case, the thermocouple pad terminal portions that are monitored via trace interconnections 74 and connection portions 76 provide a graduated circuit area ranging from terminal portions 72a, formed of lands of a small area/mass and comparable to those of FIG. 4, up to terminal portions 72b, which are formed as lands that have a large area/mass. Since an increased circuit area produces greater thermal loading, increased circuit areas will lengthen the time it takes to heat a solder joint thereat. Thus, a pattern as shown in FIG. 5 can be utilized to emulate a circuit board having wide traces or a ground plane attached to the pad. It is noted that, in addition to this technique, other techniques can be used to simulate ground planes (or other heat sinks) on or in a printed circuit board which may be a single layer or multilayer board. For example, with reference to FIG. 3, the diameter of the through hole can be varied and/or the thickness of the hole wall plating 47 can be varied. As a result, electronic assemblies and processes resulting in complex temperature profiles can be emulated. For example, many of the thermal characteristics of multilayer printed circuit boards may be emulated by a much less expensive double-sided board made according to the present invention.

FIG. 6 shows a pattern mask 80 for a large, surface mount component having 17 leads on each side, but with terminal portions 82a for forming thermocouple junctions at only three spaced locations at each side (such as at the third, eighth and fifteenth lead), as well as terminal portions 82b spaced 0.2 inches away from the center of the row of terminal portions 82 at each side. Such an arrangement allows a complex profile of temperatures of the component and surrounding area to be obtained during various processes. In this regard, while only 16 thermocouples are shown in FIG. 6 (or for that matter in FIGS. 4 and 5 as well), the number of thermocouples is limited only by the amount of space available and the interconnection capabilities via the lead traces 84 and monitoring connection portions 86. Furthermore, the use of thermocouple arrangements of the type shown in FIG. 6 is particularly advantageous with regard to, the evaluation of densely populated board assemblies to determine the thermal effects transferred to components that are not being directly operated on and can involve monitoring of thermocouple junctions of adjacent patterns, not only those junctions of the pattern pertaining to the component that is being directly subjected to a thermally affecting process during a particular emulation.

It should also be appreciated, from the foregoing, that various permutations of (a) thermal mass configurations, (b) heat source locations, and (c) thermocouple junction location can be created, in accordance with the present invention, so as to be able to emulate a wide assortment of printed circuit board sizes, types, layouts and assembly configurations as well as to evaluate a wide variety of soldering/desoldering processes, or other types of production, repair or rework operations requiring the application of heat to a printed circuit board arrangement.

Furthermore, while the printed circuit board thermocouple arrangements in accordance with the present invention have all been described relative to arrangements wherein the thermocouple junctions are formed on an electrically insulative support that simulates the effect experienced at various locations on different types of printed circuit boards, it should be appreciated that due to the use of conventional printed circuit techniques to create the thermocouples, other possibilities exist. For example, the printed circuit thermocouples could be formed within a simulated chip, wherein the number of printed circuit thermocouples corresponds to the number of chip leads. Alternatively, the number of printed circuit thermocouples formed on the chip substrate, serving as the electrically insulative support, could be less than the number of chip leads, whereby some of the chip leads may be connected to a heat source and others to an output analyzer. In this way, temperature data pertaining to a production, repair or rework operation being performed on a printed circuit board can be obtained in a manner reflecting the heat effects which are directly experienced by an electronic component itself, thereby further expanding upon the ability to train personnel, to develop, adjust and monitor any thermally affecting process, such as soldering, and to evaluate process equipment in accordance with the present invention using, for example, an analyzer that can store time and temperature curves, as described in the referenced U.S. Pat. No. 4,224,744.

Those of ordinary skill in the art will also recognize that the materials described as examples for use in construction of the present invention represent only one possibility for which many substitutes are available. For example, instead of using a support formed of a glass reinforced epoxy circuit board substrate, ceramic, polyimide or polyimide/"Kevlar" laminates may be used. Furthermore, instead of forming T-type thermocouple junctions, K-type or J-type thermocouple junctions could be formed using conductor foils of chromel/alumel or iron/constantan, respectively.

Moreover, it should be appreciated that a printed circuit thermocouple and the methods by which it is made and used as described above, for purposes such as have been described above pertaining to the training of personnel and evaluation of equipment, etc., represent only a preferred intended application of the invention on the part of the inventors which, by no means, reflects the full utility of the invention. That is, an array of thermocouples on a printed circuit thermocouple arrangement, in accordance with the present invention, could be utilized for almost any situation wherein it would be desirable to obtain a temperature profile of thermal effects. For example, thermal insulation or heat loss effects could be evaluated in a manner similar to that achievable by way of infrared photography, by covering one or more surfaces of a subject of study with a printed circuit thermocouple arrangement having suitable pattern(s) of thermocouples produced in accordance with the present invention. Furthermore, by using a flexible circuit board type substrate, such as one formed of polyimide or polyimide/Kevlar, a thermocouple arrangement could be easily applied to arcuate and other nonplanar surfaces.

Still further, the method of fabricating thermocouples via printed circuit technology in accordance with the present invention even offers a new, lower cost alternative to conventionally constructed thermocouples for use as a substitute for such standard thermocouples in any application for which small individual thermocouples have been heretofore used. In particular, a single large support could be formed with a myriad of individual thermocouple junctions in accordance with the present invention, which support, with the thermocouples formed thereon, then being cut up into a corresponding number of individual thermocouple elements, each of which has a respective one of thermocouple junctions thereon, at a fraction of the cost associated with the existing techniques for producing thermocouple elements. Here again, the use of thin flexible substrate materials may be advantageous.

Thus, since the present invention is susceptible of numerous other changes and modifications as will be apparent to those of ordinary skill in the art, the present invention should not be considered to be limited to the details of the various embodiments shown and described herein, but rather should be viewed as encompassing all such changes and modifications as are within the scope of the appended claims.

We claim:

1. Thermocouple arrangement for providing temperature data, resulting from use of at least one thermally affecting process on an electronic assembly via simulated production/rework/repair operation, comprising an electrically insulative support, a layer of a first conductor material applied on a first surface of said support, at least one printed circuit pattern of a second conductor material, that is dissimilar to said first conductor material, formed on at least one other surface of the support; wherein said printed circuit pattern is comprised of circuitry having thermocouple pad terminal portions, signal monitoring connection portions and trace interconnections running therebetween; wherein at least one thermocouple pad terminal portion of the printed circuit pattern of the second conductor is connected to the layer of the first conductor material by an electrical connection that is formed of said first conductor material and which extends through said support therebetween in a manner creating a thermocouple junction on the respective thermocouple pad terminal portion due to the first conductor material which forms the electrical connection extending through and into overlying relationship with said at least one thermocouple pad portion; wherein said printed circuit pattern of the second conductor material has a plurality of electrically connected terminal portions, and wherein the circuitry for some of said terminal portions is of a different area relative to the area of other of said terminal portions for simulating differing thermal mass configurations.

2. Thermocouple arrangement according to claim 1, wherein said layer of first conductor material is a printed circuit pattern having signal monitoring and terminal portions, and trace interconnections running therebetween.

3. Thermocouple arrangement according to claim 2, wherein said printed circuit patterns are formed on opposite outer side surfaces of said electrically insulative support.

4. Thermocouple arrangement according to claim 3, wherein said electrical connection is formed by first conductor material being plated through a through hole in the support and onto terminal portions of said printed circuit patterns in a manner mechanically as well as electrically connecting the terminal portions of the patterns of the first and second conductor materials.

5. Thermocouple arrangement according to claim 4, wherein some of said thermocouple pad terminal portions are situated at locations corresponding with a lead array of an electrical component to be mounted on the support, and wherein other of said thermocouple pad terminal portions are disposed in an area surrounding said corresponding locations for providing temperature data at locations that are disposed away from areas at which the production/rework/repair operation is performed.

6. Thermocouple arrangement according to claim 1, wherein said thermocouple junction is constructed for surface mounting of a lead of an electrical component thereon.

7. Thermocouple arrangement according to claim 1, wherein said thermocouple junction is constructed for through hole mounting of a lead of an electrical component thereon.

8. Thermocouple arrangement according to claim 1, wherein said layer of first conductor material is formed of a foil covering said first surface of said electrically insulative support, at least in an area thereof that is coextensive with an area of said other surface of the support upon which said printed circuit pattern is formed.

9. Thermocouple arrangement according to claim 1, wherein said electrically insulative support is formed of a plurality of circuit board layers, wherein said layer of first conductor material is formed on an interface surface of the support located between a pair of said board layers and wherein a said printed circuit pattern of the second conductor material is formed at each of opposite outer surfaces of said board.

10. Thermocouple arrangement according to claim 9, wherein the layer of said first conductor material covers said interface surface.

11. Thermocouple arrangement according to claim 9, wherein said layer of first conductor material is a printed circuit pattern having signal monitoring and terminal portions, and trace interconnections therebetween.

12. Thermocouple arrangement according to claim 9, wherein said electrically insulative support is comprised of at least three circuit board layers, and wherein at least one additional pattern of second conductor material is disposed at a respective additional interface surface of the support in a manner forming intermediate thermocouple junctions at locations at which the additional pattern intersects the electrical connections extending between the layer of first conductor material and the patterns of second conductor material formed on the outer surfaces of the support.

13. Thermocouple arrangement according to claim 12, wherein the layer of said first conductor material covers said interface surface.

14. Thermocouple arrangement according to claim 12, wherein said layer of first conductor material is a printed circuit pattern having signal monitoring and terminal portions, and trace interconnections therebetween.

15. Thermocouple arrangement according to claim 9, wherein said thermocouple junction of at least one of said patterns is constructed for surface mounting of a lead of an electrical component thereon.

16. Thermocouple arrangement according to claim 9, wherein said thermocouple junction of at least one of said patterns is constructed for through hole mounting of a lead of an electrical component thereon.

17. Thermocouple arrangement according to claim 9, wherein at least one said electrical connection is constructed as a means for simulating a heat sink.

18. Thermocouple arrangement according to claim 1, wherein said conductor materials are selected from the group consisting of copper and constantan, chromel and alumel, and iron and constantan.

19. Thermocouple arrangement for providing temperature data, resulting from use of at least one thermally affecting process on an electronic assembly via simulated production/rework/repair operation, comprising an electrically insulative support, a layer of a first conductor material applied on a first surface of said support, at least one printed circuit pattern of a second conductor material, that is dissimilar to said first conductor material, formed on at least one other surface of the support; wherein said printed circuit pattern is comprises of circuitry having thermocouple pad terminal portions, signal monitoring connection portions and trace interconnections running therebetween; wherein at least one thermocouple pad terminal portion of the printed circuit pattern of the second conductor is connected to the layer of the first conductor material by an electrical connection that is formed of said first conductor material and which extends through said support therebetween in a manner creating a thermocouple junction on the respective thermocouple pad terminal portion due to the first conductor material which forms the electrical connection extending through and into overlying relationship with said at least one thermocouple pad portion; wherein said printed circuit pattern of the second conductor material has a plurality of electrically connected terminal portions, and wherein the circuitry for some of said terminal portions is of a different area relative to the area of other of said terminal portions for simulating differing thermal mass configurations; wherein said electrical connection is formed by first conductor material being plated through a through hole in the support and onto terminal portions of said printed circuit patterns in a manner mechanically as well as electrically connecting the terminal portions of the patterns of the first and second conductor materials; wherein the amount of first conductor material provided in a said through hole is predetermined as a means for simulating heat sinks.

* * * * *